United States Patent
Korzenski et al.

(10) Patent No.: US 6,943,139 B2
(45) Date of Patent: Sep. 13, 2005

(54) REMOVAL OF PARTICLE CONTAMINATION ON PATTERNED SILICON/SILICON DIOXIDE USING SUPERCRITICAL CARBON DIOXIDE/CHEMICAL FORMULATIONS

(75) Inventors: Michael B. Korzenski, Danbury, CT (US); Eliodor G. Ghenciu, King of Prussia, PA (US); Chongying Xu, New Milford, CT (US); Thomas H. Baum, New Fairfield, CT (US)

(73) Assignee: Advanced Technology Materials, Inc., Danbury, CT (US)

( * ) Notice: Subject to any disclaimer, the term of this patent is extended or adjusted under 35 U.S.C. 154(b) by 226 days.

(21) Appl. No.: 10/284,861

(22) Filed: Oct. 31, 2002

(65) Prior Publication Data

US 2004/0087456 A1 May 6, 2004

(51) Int. Cl.[7] .................................................. B08B 3/00

(52) U.S. Cl. ...................... 510/176; 510/175; 134/1.63; 134/2; 134/3; 438/692; 438/745

(58) Field of Search ................................ 510/175, 176, 510/177; 134/1, 3, 2, 26; 438/745, 692; 216/88; 451/37, 41

(56) References Cited

U.S. PATENT DOCUMENTS

| | | | | | |
|---|---|---|---|---|---|
| 5,866,005 | A | * | 2/1999 | DeSimone et al. | 210/634 |
| 6,149,828 | A | | 11/2000 | Vaartstra | |
| 6,306,564 | B1 | * | 10/2001 | Mullee | 430/329 |
| 6,331,487 | B2 | * | 12/2001 | Koch | 438/692 |
| 6,669,785 | B2 | * | 12/2003 | DeYoung et al. | 134/3 |
| 6,764,552 | B1 | * | 7/2004 | Joyce et al. | 134/3 |

* cited by examiner

Primary Examiner—Gregory Webb
(74) Attorney, Agent, or Firm—Steven J. Hultquist; Margaret Chappuis; Tristan A. Fuierer

(57) ABSTRACT

A cleaning composition for cleaning particulate contamination from small dimensions on semiconductor substrates. The cleaning composition contains supercritical $CO_2$ (SCCO2), alcohol, fluoride source and, optionally, hydroxyl additive. Such cleaning composition overcomes the intrinsic deficiency of SCCO2 as a cleaning reagent, viz., the nonpolar character of SCCO2 and its associated inability to solubilize species such as inorganic salts and polar organic compounds that are present in particulate contamination on wafer substrates and that must be removed from the semiconductor substrate for efficient cleaning. The cleaning composition enables damage-free, residue-free cleaning of substrates having particulate contamination on $Si/SiO_2$ substrates.

27 Claims, 1 Drawing Sheet

US 6,943,139 B2

REMOVAL OF PARTICLE CONTAMINATION ON PATTERNED SILICON/SILICON DIOXIDE USING SUPERCRITICAL CARBON DIOXIDE/CHEMICAL FORMULATIONS

FIELD OF THE INVENTION

The present invention relates to supercritical carbon dioxide-based compositions useful in semiconductor manufacturing for the removal of particle contamination from patterned silicon/silicon dioxide substrates having such particle contamination thereon, and to methods of using such compositions for removal of particle contamination from semiconductor substrates.

DESCRIPTION OF THE RELATED ART

In the field of semiconductor manufacturing, various methods are in use for cleaning of wafers to remove particle contamination. These methods include ultrasonics, high pressure jet scrubbing, excimer laser ablation, and carbon dioxide snow-jet techniques, to name a few.

The use of air to blow away particles from semiconductor substrates has been extensively investigated in recent years, as well as the dynamics of liquid jets for cleaning.

All of the methods developed to date have associated deficiencies.

More generally, the problems attendant the removal of contaminant particles from semiconductor substrates include the fact that surface contamination may be organic and/or inorganic in character, thereby complicating the cleaning process from the perspective of selecting compatible cleaning agents. In addition, not all surfaces to be cleaned are smooth and may possess varying degrees of roughness due to previous etching and/or deposition processes, thereby complicating the cleaning procedure. Still further, there exist several forces of adhesion, such as Van der Waals force of attraction, electrostatic interactions, gravity and chemical interactions, which impact the removal of contaminant particles. Accordingly, flow characteristics, chemistry and physical aspects are all involved, and complicate the removal of particulate contamination.

There is therefore a continuing need in the field for improved cleaning technology, since removal of particle contaminants from wafer surfaces is critical to ensure proper operation of the microelectronic device that is the ultimate product of the semiconductor manufacturing process, and to avoid interference or deficiency in relation to subsequent process steps in the manufacturing process.

SUMMARY OF THE INVENTION

The present invention relates to supercritical carbon dioxide-based compositions useful in semiconductor manufacturing for the removal of contaminant particles from substrates having such particles thereon, and methods of using such compositions for removal of contaminant particles from semiconductor substrates.

In one aspect, the invention relates to a particle contamination cleaning composition, comprising SCCO2, alcohol, fluorine source and, optionally, hydroxyl additive.

In another aspect, the invention relates to a particle contamination cleaning composition, comprising SCCO2, methanol, ammonium fluoride, fluorinated surfactant, and boric acid, wherein methanol is present at a concentration of from about 5 to about 20 wt. %, fluoride is present at a concentration of from about 0.01 to about 2.0 wt. %, and boric acid is present at a concentration of from about 0.01 to about 2.0 wt. %, based on the total weight of the cleaning composition.

A further aspect of the invention relates to a method of removing particle contamination from a substrate having same thereon, said method comprising contacting the particle contamination with a cleaning composition comprising SCCO2, alcohol, fluorine source and, optionally, hydroxyl additive, for sufficient time and under sufficient contacting conditions to remove the particle contamination from the substrate.

Other aspects, features and embodiments of the invention will be more fully apparent from the ensuing disclosure and appended claims.

DETAILED DESCRIPTION OF THE INVENTION AND PREFERRED EMBODIMENTS THEREOF

Figure 1:
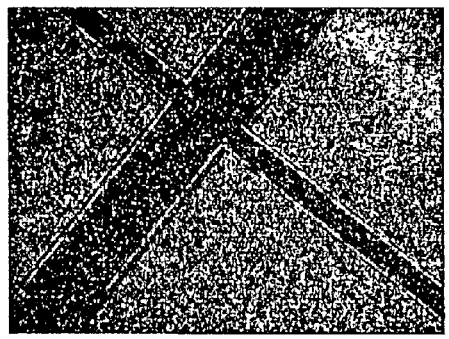
FIG. 1 is an optical microscope photograph of a wafer comprising a patterned silicon dioxide layer and silicon layer, showing contaminant particles of SiN thereon, subsequent to cleaning thereof with SCCO2/methanol solution.

The present invention is based on the discovery of a supercritical carbon dioxide-based cleaning composition that is highly efficacious for the removal of contaminant particles from semiconductor substrates on which same are present. The compositions and methods of the invention are effective for removal of surface particles, including particles of organic and/or inorganic composition, from silicon and silicon dioxide regions of both blanket and patterned wafers.

Supercritical carbon dioxide (SCCO2) might at first glance be regarded as an attractive reagent for removal of particulate contaminants, since supercritical $CO_2$ has the characteristics of both a liquid and a gas. Like a gas, it diffuses rapidly, has low viscosity, near-zero surface tension, and penetrates easily into deep trenches and vias. Like a liquid, it has bulk flow capability as a "wash" medium.

Despite these ostensible advantages, however, supercritical $CO_2$ is non-polar. Accordingly, it will not solubilize many species, including inorganic salts and polar organic compounds that are present in many contaminant particles and that must be removed from the semiconductor substrate for efficient cleaning. The non-polar character of SCCO2 thus poses an impediment to its use for cleaning of wafer surfaces of contaminant particles.

Such deficiency of supercritical $CO_2$ has been overcome by the present invention in the provision of a SCCO2-based composition that is highly effective for cleaning of particles from silicon and silicon dioxide regions of both blanket and patterned wafers, and achieves damage-free, residue-free cleaning of the substrate having such contaminant particles thereon.

More specifically, the present invention contemplates a particle contamination cleaning composition including SCCO2, alcohol, fluorine source and, optionally, hydroxyl additive.

The composition of the invention has utility for cleaning particulate contamination from small dimensions on semiconductor substrates without further attack on Si-containing regions of the $Si/SiO_2$ wafer.

In the cleaning composition, the fluorine source aids in the removal of silicon impurities that reside on the $Si/SiO_2$ surface. The fluorine source may be of any suitable type, e.g., a fluorine-containing compound or other fluoro species. Illustrative fluorine source components include hydrogen fluoride (HF), triethylamine trihdyrogen fluoride or other amine trihydrogen fluoride compound of the formula $NR_3(HF)_3$ wherein each R is independently selected from hydrogen and lower alkyl ($C_1$–$C_8$ alkyl), hydrogen fluoride-pyridine (pyr-HF), and ammonium fluorides of the formula $R_4NF$, wherein each R is independently selected from hydrogen and lower ($C_1$–$C_8$ alkyl), etc. Ammonium fluoride ($NH_4F$) is a presently preferred fluorine source in compositions of the invention, although any other suitable fluoro source component(s) may be employed with equal success.

The composition may also include fluorinated surfactant (s), which provide additional fluorine and fluoride in the composition.

The optional hydroxyl additive functions to protect the wafer from additional oxidation. Boric acid is a presently preferred hydroxyl additive, although other hydroxyl agents may also be advantageously employed for such purpose, e.g., 3-hydroxy-2-naphthoic acid. Further, the hydroxyl additive may also be a fluorine source, e.g., 2-fluorophenol, etc.

The alcohol used to form the SCCO2/alcohol solution as the solvent phase of the cleaning composition may be of any suitable type. In one embodiment of the invention, such alcohol comprises a $C_1$–$C_4$ alcohol (i.e., methanol, ethanol, propanol, or butanol), or a mixture of two or more of such alcohol species.

In a preferred embodiment, the alcohol is methanol. The presence of the alcoholic co-solvent with the SCCO2 serves to increase the solubility of the composition for inorganic salts and polar organic compounds present in the particulate contamination. In general, the specific proportions and amounts of SCCO2 and alcohol in relation to each other may be suitably varied to provide the desired solubilizing (solvating) action of the SCCO2/alcohol solution for the particulate contamination, as readily determinable within the skill of the art without undue effort. The concentration of the alcohol may be in a range of from about 5 to about 20 wt. %, based on the total weight of the composition.

In one embodiment, the cleaning composition of the invention includes SCCO2, alcohol, ammonium fluoride, fluorinated surfactant, and boric acid.

In a preferred composition of such character, as particularly adapted to cleaning of $Si/SiO_2$ wafer surfaces, ammonium fluoride is present at a concentration of from about 0.01 to about 1.0 wt. %, and boric acid is present at a concentration of from about 0.01 to about 1.0 wt. %, based on the total weight of the cleaning composition.

The cleaning composition can be employed to contact a substrate having particulate contamination thereon at a pressure in a range of from about 1000 to about 7500 psi for sufficient time to effect the desired removal of the particulate contamination from the substrate, e.g., for a contacting time in a range of from about 5 to about 30 minutes and a temperature of from about 35 to about 100° C., although greater or lesser contacting durations and temperatures may be advantageously employed in the broad practice of the present invention, where warranted.

In one embodiment, especially high removal of SiN particles from an Si/SiO2 substrate was achieved by SCCO2/alcohol (15 wt %)/fluoride (0.55 wt %) solutions at a temperature and pressure of 55° C. and 4000 psi, respectively, using a processing time of 30 minutes (10 minute dynamic flow, 10 minute static soak, 10 minute dynamic flow, followed by a three volume SCCO2/methanol (20 wt %) rinse and pure three volume SCCO2 rinse).

The cleaning process in a particularly preferred embodiment includes sequential processing steps including dynamic flow of the cleaning composition over the substrate having the particulate contamination thereon, followed by a static soak of the substrate in the cleaning composition, with the respective dynamic flow and static soak steps being carried out alternatingly and repetitively, in a cycle of such alternating steps.

For example, the dynamic flow/static soak steps may be carried out for three successive cycles in the aforementioned illustrative embodiment of contacting time of 30 minutes, as including a sequence of 10 minutes dynamic flow, 10 minutes static soak, and 10 minutes dynamic flow.

Following the contacting of the cleaning composition with the substrate bearing the particulate contamination, the substrate thereafter preferably is washed with copious amounts of SCCO2/alcohol solution (not containing any other components), e.g., a 20% methanol solution, in a first washing step, to remove any residual precipitated chemical additives from the substrate region in which removal of particulate contamination has been effected, and finally with copious amounts of pure SCCO2, in a second washing step, to remove any residual alcohol co-solvent and/or precipitated chemical additives from the substrate region.

The features and advantages of the invention are more fully shown by the empirical efforts and results discussed below.

The sample wafers examined in this study included silicon nitride particles residing on a patterned silicon dioxide layer and silicon layer. The samples were first processed using pure SCCO2 at 50° C. and 4400 psi, and although the velocity of the flowrate (10 mL/min) removed some of the particles, it was ineffective at completely removing all of the contaminate particles.

FIG. 1 is an optical microscope photograph of this wafer comprising a patterned silicon dioxide layer and silicon layer, showing contaminant particles of SiN thereon, subsequent to cleaning thereof with SCCO2/methanol solution.

Various chemical additives/surfactants then were added to the SCCO2/methanol solution and their particle removal efficiency was examined.

Figure 2:
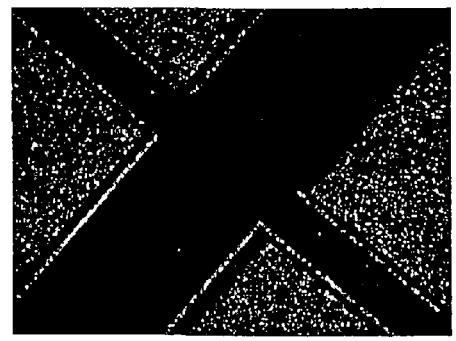
FIG. 2 is an optical microscope photograph of a wafer of the type shown in FIG. 1, after cleaning with a cleaning composition containing SCCO2, methanol and ammonium fluoride and boric acid.

FIG. 2 shows the optical image of the wafer cleaned with a SCCO2/methanol/boric acid/$NH_4F$ solution at 50° C. and clearly shows that the SiN particles are removed from the $SiO_2$ surface, however, this cleaning solution was not effective toward removing the particles from the silicon regions. The boric acid was used both to protect the $SiO_2$ surface from attack by the fluoride ions, as well as to hydrogen bond to the silicon oxide surface to assist in lift-off of the particles which are most likely held via Van der Waals forces. The fluoride source was used to aid in particle removal by chemically reacting with the SiN particles, thus aiding in their removal from the wafer surface. A covalent fluoride source, that does not generate HF upon exposure to moisture, is generally desired for particle removal from silicon surfaces.

Figure 3:
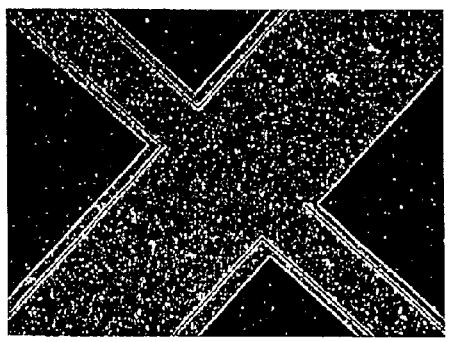
FIG. 3 is an optical microscope photograph of a wafer of the type shown in FIG. 1, after cleaning with a cleaning composition containing SCCO2, methanol and a fluorinated surfactant.

FIG. 3 is an optical microscope photograph of a wafer of the type shown in FIG. 1, after cleaning with a cleaning composition containing SCCO2, methanol and a fluorinated surfactant. As can be seen from FIG. 3, the SCCO2/methanol/F-surfactant solution did not remove particles from the $SiO_2$ surface.

Figure 4:
FIG. 4 is an optical microscope photograph of a wafer of the type shown in FIG. 1, after cleaning with a cleaning composition containing SCCO2, methanol, ammonium fluoride, boric acid and a fluorinated surfactant.

FIG. 4 is an optical microscope photograph of a wafer of the type shown in FIG. 1, after cleaning with a cleaning composition containing SCCO2, methanol, ammonium fluoride, boric acid and a fluorinated surfactant, showing that such composition successfully removed surface particles from the entire patterned wafer.

The above-described photographs thus evidence the efficacy of cleaning compositions in accordance with the invention, for removal of particulate contamination on wafer substrates.

The cleaning compositions of the present invention are readily formulated by simple mixing of ingredients, e.g., in a mixing vessel under gentle agitation.

Once formulated, such cleaning compositions are applied to the substrate for contacting with the residue thereon, at suitable elevated pressures, e.g., in a pressurized contacting chamber to which the cleaning composition is supplied at suitable volumetric rate and amount to effect the desired contacting operation for removal of the post etch residue removal.

It will be appreciated that specific contacting conditions for the cleaning compositions of the invention are readily determinable within the skill of the art, based on the disclosure herein, and that the specific proportions of ingredients and concentrations of ingredients in the cleaning compositions of the invention may be widely varied while achieving desired removal of the post etch residue from the substrate.

Accordingly, while the invention has been described herein in reference to specific aspects, features and illustrative embodiments of the invention, it will be appreciated that the utility of the invention is not thus limited, but rather extends to and encompasses numerous other aspects, features and embodiments. Accordingly, the claims hereafter set forth are intended to be correspondingly broadly construed, as including all such aspects, features and embodiments, within their spirit and scope.

What is claimed is:

1. A post-etch residue cleaning composition, comprising SCCO2, alcohol, fluorine source, fluorinated surfactant and hydroxyl additive, wherein the hydroxyl additive comprises a compound selected from the group consisting of boric acid, 3-hydroxy-2-naphthoic acid and 2-fluorophenol.

2. The composition of claim 1, wherein the alcohol comprises at least one $C_1$–$C_4$ alcohol.

3. The composition of claim 1, wherein the alcohol comprises methanol.

4. The composition of claim 1, wherein the fluorine source comprises a fluorine-containing compound selected from the group consisting of hydrogen fluoride (HF), amine trihydrogen fluoride compounds of the formula $NR_3(HF)_3$ wherein each R is independently selected from hydrogen and lower alkyl, hydrogen fluoride-pyridine (pyr-HF), and ammonium fluorides of the formula $R_4NF$, wherein each R is independently selected from hydrogen and lower alkyl.

5. The composition of claim 1, wherein the fluorine source comprises ammonium fluoride ($NH_4F$).

6. The composition of claim 1, wherein the hydroxyl additive comprises boric acid.

7. The composition of claim 1, wherein the hydroxyl additive hydroxyl additive is also at least a part of said fluorine source.

8. The composition of claim 1, wherein the hydroxyl additive hydroxyl additive and fluorine source comprises 2-fluorophenol.

9. The composition of claim 1, wherein said alcohol has a concentration in a range of from about 5 to about 20 wt. %, based on total weight of the composition.

10. The composition of claim 1, wherein the fluorine source has a concentration of from about 0.01 to about 2.0 wt. %, based on the total weight of the cleaning composition.

11. The composition of claim 1, comprising ammonium fluoride, a fluorinated surfactant and boric acid.

12. The composition of claim 11, wherein ammonium fluoride has a concentration of from about 0.1 to about 2.0 wt. %, based on the total weight of the cleaning composition.

13. A particle contamination cleaning composition, comprising SCCO2, methanol, ammonium fluoride, fluorinated surfactant, and boric acid, wherein methanol is present at a concentration of from about 5 to about 20 wt. %, fluoride is present at a concentration of from about 0.01 to about 2.0 wt. %, and boric acid is present at a concentration of from about 0.01 to about 2.0 wt. %, based on the total weight of the cleaning composition.

14. A method of removing particle contamination from a substrate having same thereon, said method comprising contacting the particle contamination with a cleaning composition comprising SCCO2, alcohol, fluorine source, fluorinated surfactant and, hydroxyl additive, for sufficient time and under sufficient contacting conditions to remove the particle contamination from the substrate, wherein the hydroxyl additive comprises a compound selected from the group consisting of boric acid, 3-hydroxy-2-naphthoic acid and 2-fluorophenol.

15. The method of claim 14, wherein said contacting conditions comprise elevated pressure.

16. The method of claim 15, wherein said elevated pressure comprises pressure in a range of from about 1000 to about 7500 psi.

17. The method of claim 14, wherein said contacting time is in a range of from about 5 to about 30 minutes.

18. The method of claim 14, wherein the fluorine source comprises a fluorine-containing compound selected from the group consisting of hydrogen fluoride (HF), amine trihydrogen fluoride compounds of the formula $NR_3(HF)_3$ wherein each R is independently selected from hydrogen and lower alkyl, hydrogen fluoride-pyridine (pyr-HF), and ammonium fluorides of the formula $R_4NF$, wherein each R is independently selected from hydrogen and lower alkyl.

19. The method of claim 14, wherein the fluorine source comprises ammonium fluoride ($NH_4F$).

20. The method of claim 14, wherein said composition comprises SCCO2, methanol, ammonium fluoride, fluorinated surfactant, and boric acid, wherein methanol is present at a concentration of from about 5 to about 20 wt. %, fluoride is present at a concentration of from about 0.01 to about 2.0 wt. %, and boric acid is present at a concentration of from about 0.01 to about 2.0 wt. %, based on the total weight of the cleaning composition.

21. The method of claim 14, wherein the contacting step comprises a cleaning cycle including (i) dynamic flow contacting of the cleaning composition with the post-etch residue, and (ii) static soaking contacting of the cleaning composition with the post-etch residue.

22. The method of claim 21, wherein said cleaning cycle comprises alternatingly and repetitively carrying out dynamic flow contacting (i) and static soaking contacting (ii) of the post-etch residue.

23. The method of claim 22, wherein said cleaning cycle comprises carrying out (i) dynamic flow contacting and (ii) static soaking contacting in sequence, and repeating said sequence three times.

24. The method of claim 14, further comprising the step of washing the substrate at a region at which the particulate contamination has been removed, with a SCCO2/alcohol wash solution in a first washing step, and with SCCO2 in a second washing step, to remove residual precipitated chemical additives in said first washing step, and to remove residual precipitated chemical additives and/or residual alcohol in said second washing step.

25. A post-etch residue cleaning composition, comprising SCCO2, alcohol, and 2-fluorophenol.

26. The post-etch residue cleaning composition of claim 25, wherein the alcohol comprises a $C_1$–$C_4$ alcohol.

27. A method of cleaning a substrate to remove post-etch residue therefrom, said method comprising contacting the substrate with a photoresist cleaning composition as claimed in claim 25.

* * * * *